United States Patent [19]

Kinoshita et al.

[11] 4,346,456

[45] Aug. 24, 1982

[54] MAGNETIC BUBBLE DEVICE

[75] Inventors: Ryoichi Kinoshita; Shobu Orihara, both of Kawasaki, Japan

[73] Assignee: Fujitsu Limited, Kawasaki, Japan

[21] Appl. No.: 68,626

[22] Filed: Aug. 22, 1979

[30] Foreign Application Priority Data

Aug. 30, 1978 [JP] Japan .................. 53-105983

[51] Int. Cl.³ .................................. G11C 19/08
[52] U.S. Cl. ........................... 365/36; 365/28
[58] Field of Search .................. 365/36, 27, 28

[56] References Cited

U.S. PATENT DOCUMENTS 3,792,452  2/1974  Dixon et al. ............... 365/36
3,914,751  10/1975 Keefe et al. ............... 365/36
3,938,110  2/1976  Kataoka et al. ............ 365/36

OTHER PUBLICATIONS

IEEE Transactions on Magnetics-vol. 13, No. 6, Nov. 1977, pp. 1744-1764.

*Primary Examiner*—James W. Moffitt
*Attorney, Agent, or Firm*—Staas & Halsey

[57] ABSTRACT

A magnetic bubble device in which ions are implanted, under different conditions, in at least two kinds of regions of a magnetic thin film serving as a medium for propagation of a magnetic bubble. In this manner, the operating margins of magnetic bubble stable operation regions of respective functional parts of the device are made nearly equal, thereby providing for improved operating margin of the device as a whole.

6 Claims, 6 Drawing Figures

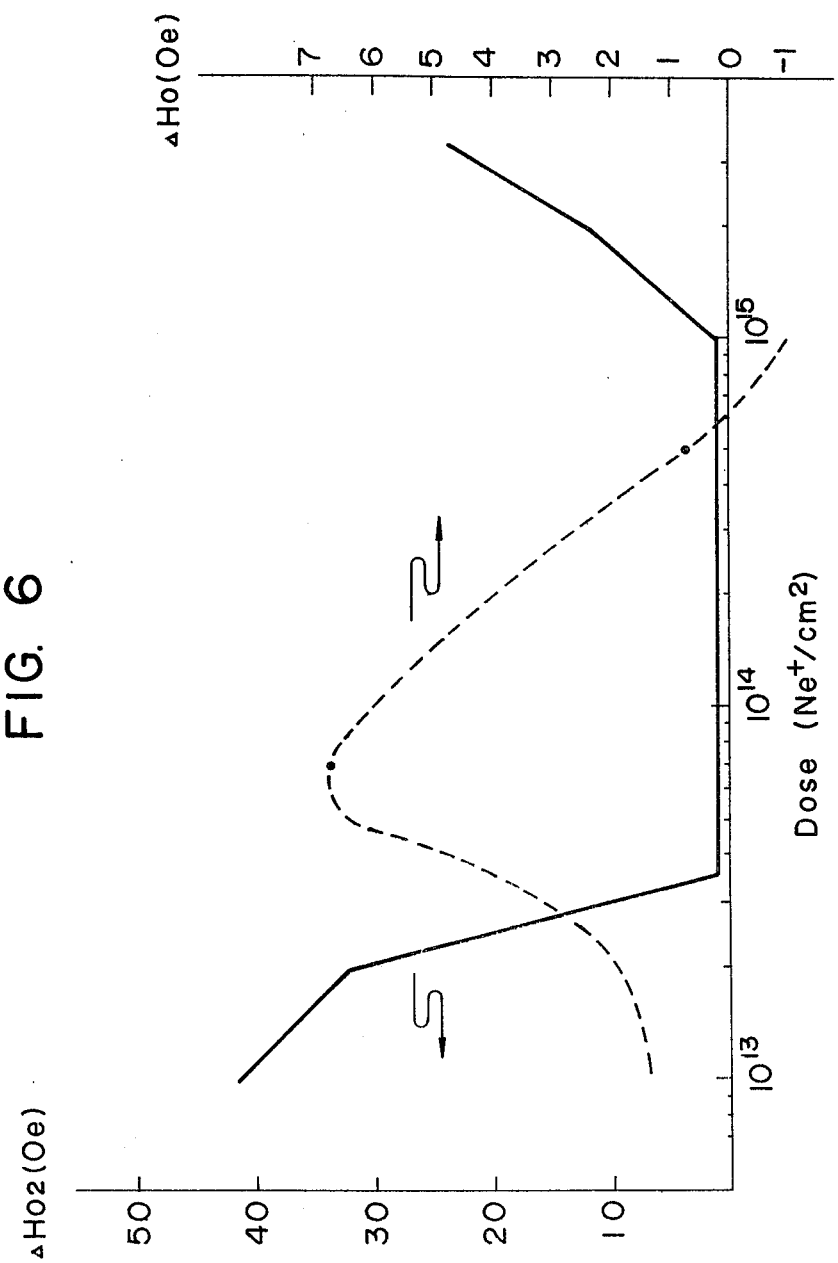

MAGNETIC BUBBLE DEVICE

BACKGROUND OF THE INVENTION

1. Field of the Invention

This invention relates to a magnetic bubble device in which the operating margins of magnetic bubble (hereinafter referred to as the bubble) stable operation regions of respective functional parts of the device are made nearly equal to provide for improved operating margin of the entire device.

2. Description of the Prior Art

In a magnetic bubble device, the bubble is merely propagated along a major or minor loop on the one hand and subjected to complicated control such that it is stretched out by a bubble detector on the other hand. In the former case of mere propagation the bubble remains in its normal shape and size, but in the latter case, the bubble stretches and becomes complex in shape. The bias field value for stable operation of the bubble differs in dependence on whether the bubble operates in its normal or stretched state. FIG. 1 is a graph showing how the bias field value differs, the abscissa representing the rotating-field intensity $H_R$ (Oe), and the ordinate the bias-field intensity $H_B$ (Oe). In FIG. 1, the margin curves of a bubble propagation path and a bubble stretcher are shown, and the area surrounded by each curve indicates a region of stable operation of the bubble. Accordingly, in the overlapping area of the both curves as indicated by hatching, the bubble stably operates regardless of whether it is on the propagation path or the stretcher. In FIG. 1, upper and lower straight lines show a collapse field $H_{CO}$ and a strip out field $H_{so}$ of a free bubble respectively, for the purpose of comparison. As is evident from FIG. 1, the upper limit of the bias field value of the region in which the bubble is stretched by a bubble detector, is lower than the upper limit of the bias field of the propagation path where the bubble operates in its normal state. The reason is that the presence of a strong bias field makes it difficult for the bubble to stretch long and hence prevents its smooth stretching and makes its operation unstable; therefore, the bias field value is inevitably selected, to be small for stable and smooth operation of the bubble.

In the case where the operating margins differ among different functional parts in the same magnetic bubble device, as described above, the overall operating margin of the device becomes very narrow, as indicated by the hatched region. Apart from a single-chip package, in the case of mounting a plurality of chips on the same package, variation in the operating margins of the chips further reduces the operating margin of the package as a whole.

SUMMARY OF THE INVENTION

The object of the present invention is to maximize the overall operating margin of a magnetic bubble device by making the operating margins of respective functional parts of the device apparently equal.

To this end, in the present invention, ions are implanted in a magnetic bubble material for suppression of a hard-bubble, and only a bubble stretching region is further subjected to ion implantation under conditions different from those for the previous ion implantation, thereby raising the bias field value of the bubble stretching region to be substantially equal to that of the bubble propagation path.

DESCRIPTION OF THE DRAWINGS

FIG. 6 is a graph showing the relationships between the conditions for ion implantation and a collapse field of a bubble.

DESCRIPTION OF THE PREFERRED EMBOIMENTS

Figure 2:
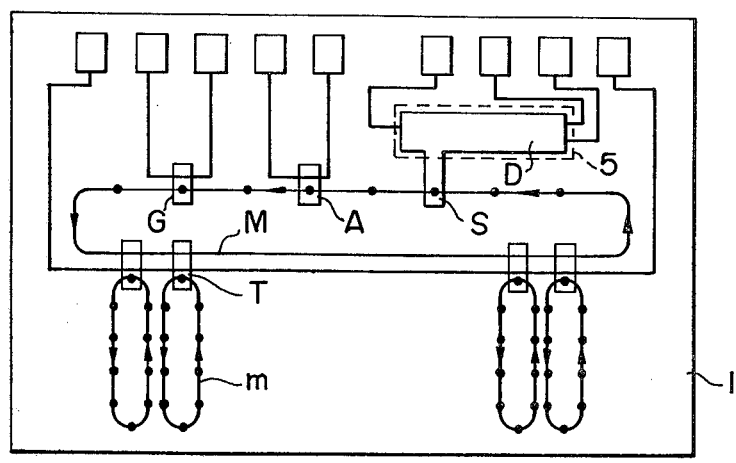
FIG. 2 schematically illustrates an embodiment of this invention as being applied to a detector of a magnetic bubble device of the type employing major and minor loops.
Figure 3:
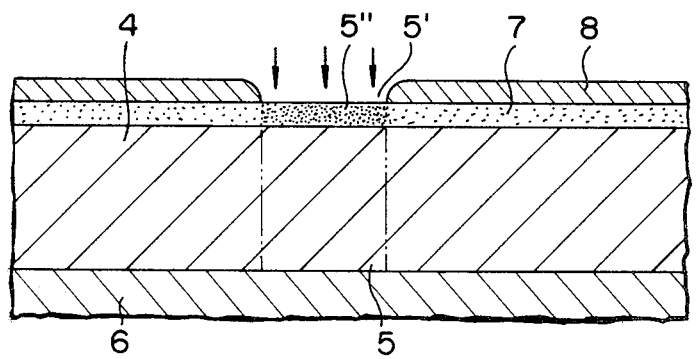
FIG. 3 is a cross-sectional view illustrating the steps involved in the manufacture of the magnetic bubble device of the present invention.
Figure 4:
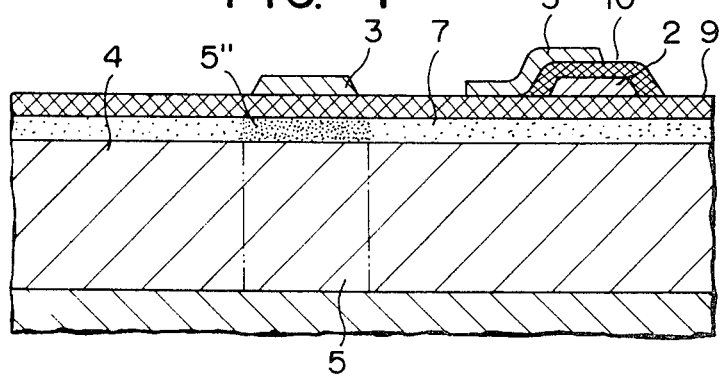
FIG. 4 is a cross-sectional view showing the magnetic bubble device in its finished state.

In FIGS. 2, 3 and 4, reference numeral 1 indicates generally a magnetic bubble device, which has formed thereon by overlay techniques using a conductor pattern 2 and permalloy patterns 3 and 3', a propagation path composed of a major loop M and minor loops m, a bubble generator G, transfer gates T for transmission and reception of a bubble between the major loop M and the minor loops m, a replicator S, a bubble eraser A, and a detector D. A bubble generated in a bubble material 4 is driven by applying a rotating field to the magnetic bubble device 1 in parallel to its surface in the presence of a bias field perpendicular to the surface of the device 1. That is, a bubble generated by the generator G is driven as information, along the major loop M and transferred therefrom via the transfer gate T to each minor loop m for storage. When the bubble is read out, it is transferred from the minor loop m via the transfer gate T to the major loop M and drive thereon and divided by the replicator S, and the divided bubble is stretched by the detector D to be enlarged more than 100 times and detected.

In FIGS. 2, 3 and 4, reference numeral 5 designates the region where the bubble is stretched. This region is formed by performing ion implementation under conditions different from those for the other regions, as will be described hereunder. That is, ion implantation is effected over the entire area of the surface of an LPF garnet film or like magnetic thin film 4 deposited on a substrate 6, forming a hard bubble suppression layer 7. Then, gold (Au) or the like is deposited by evaporation on the hard bubble suppression layer 7 to form thereon a mask layer 8. The mask layer 8 is selectively etched away to form a window 5' to expose a bubble stretch region 5 to the outside. Next, ion implantation is performed again to implant ions into the bubble stretcher 5 alone, as indicated by 5". Following this, the device 1 is heat-treated in a furnace, if necessary, after the mask layer 8 is removed. Thereafter, a spacer layer 9, the conductor pattern 2, a spacer layer 10 and the permalloy patterns 3 and 3' are formed in this order by means of vapor deposition and sputtering in known manner to obtain an overlay structure.

The first ion-implanted layer 7 is used as a hard bubble suppression layer, and the layer 5" formed by implanting ions twice is used both as a hard bubble suppression layer and a bias field control layer for facilitating smooth stretching of the bubble.

Figure 5:
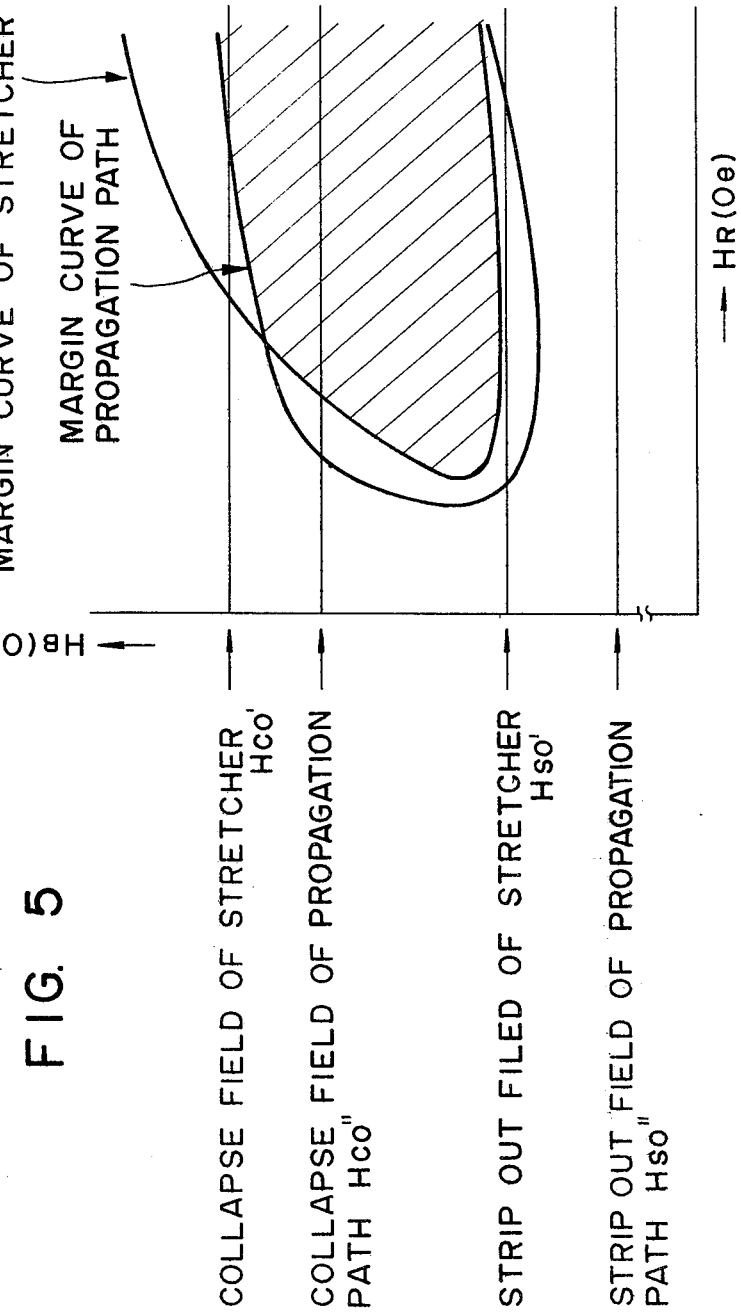
FIG. 5 is a graph showing the bias margin characteristics of the functional parts of the magnetic bubble device of the present invention.

In FIG. 5, there are shown margin curves of the propagation path and the bubble stretcher formed by ion implantation under different conditions. The abscissa represents the intensity of a rotating magnetic field $H_R$ (Oe), and the ordinate represents the intensity of a bias magnetic field $H_B$ (Oe). In FIG. 5, free bubble collapse fields $H_{CO'}$ and $H_{CO''}$ in the region of the bubble stretcher and the propagation path and free bubble strip out fields $H_{SO'}$ and $H_{CO''}$ in the region of the bubble stretcher and the propagation path are shown for the purpose of comparison.

The bias field margin curve of the propagation path having the hard bubble suppression layer 7 does not differ from that obtainable with the prior art, but the bias margin curve of the bubble stretcher having the double ion implantation layer 5" rises towards a high bias side as a whole. This means that since the double ion implantation layer 5" makes the bubble stretcher 5 unsusceptible to the influence of a bias field as compared with the other regions, the apparent margin of the bias field of the bubble stretcher 5 rises towards the high bias side and becomes nearly equal to the bias margins of the other regions. The strip out field value of the bubble stretcher also rises to become substantially equal to that of the propagation path.

The second ion implantation may be carried out under the same condition as that for the first ion implantation for the formation of the hard bubble suppression layer 7; but the bias field value can easily be controlled by selecting the kind and amount of ions implanted and the acceleration energy used.

Figure 1:
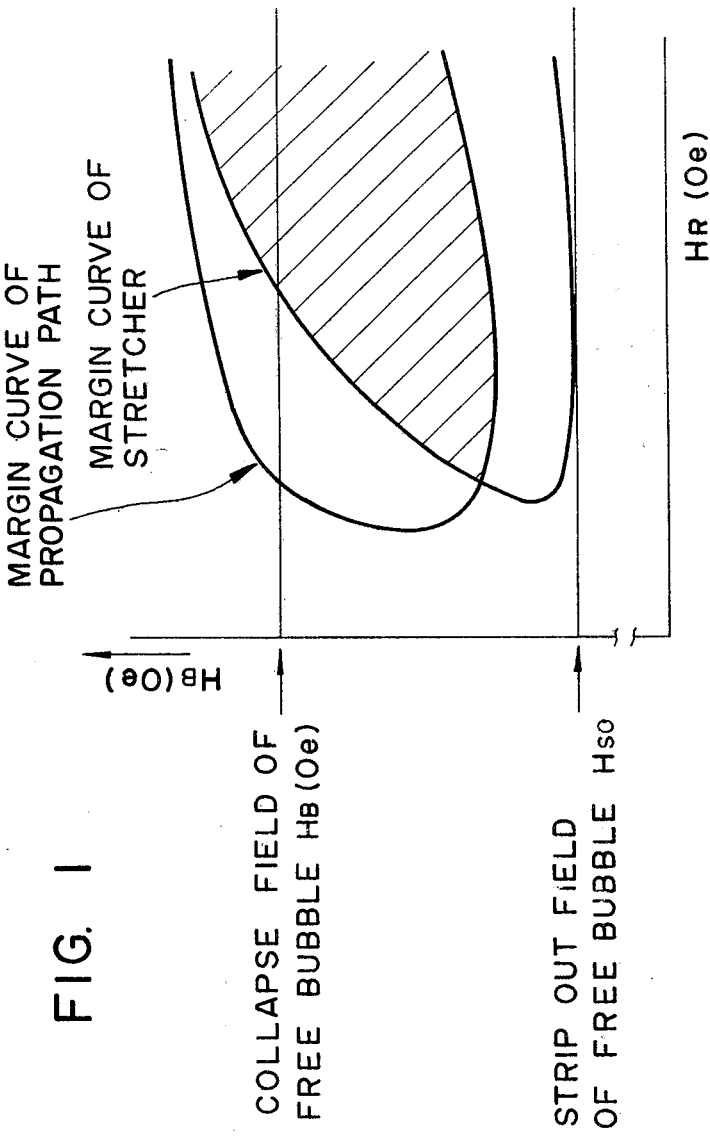
FIG. 1 is a graph showing bias margin characteristics of the functional parts of a conventional magnetic bubble device.

In the above, the bias field control layer 5" is again subjected to ion implantation after the ion implantation for the hard bubble suppression, but the hard bubble suppression layer 7 and the bias field control layer 5" may also be formed by performing ion implantation under different conditions, with each of the layers masked during ion implantation for the other. At any rate, the purpose can be achieved by forming the hard bubble suppression layer 7 and the bias field control layer 5" under conditions for ion implantation so that equal bias field values are obtained. P FIG. 6 shows the relationship between the condition for ion implantation and the collapse field $H_{CO}$. In FIG. 6, the abscissa represents the condition for ion implantation in terms of dose of neon ions per square centimeter ($Ne^+/cm^2$), and the broken line indicates variations of the collapse field caused by ion implantation, in terms of increment $\Delta H_O$ of the collapse field compared with the collapse field of a crystal as grown. FIG. 6 shows the case of an ion acceleration field being 100 KeV, and the characteristic that the increment $\Delta H_O$ of the collapse field decreases substantially linearly within the range of dose from $7 \times 10^{13}$ to $5 \times 10^{14}$ $Ne^+/cm^2$. Where the region of the stretcher and the ordinary region of the propagation path are formed by ion implantation in doses of $7 \times 10^{13}$ $Ne^+/cm^2$ and $5 \times 10^{14}$ $Ne^{30}/cm^2$ respectively, the collapse field of the ordinary region is lower than that of the stretcher region by about 6 oersteds. Accordingly, the upper limit of the margin curve of the stretcher in the case of FIG. 1 can be raised higher than the margin curve of the propagation path, and at the same time, the lower limit of the margin curve of the stretcher can also approach the margin curve of the propagation path.

The conditions for ion implantation for the hard bubble suppression layer 7 and the bubble stretcher region 5" can be made different not only by using different doses of ions, as described above, but also by using different ion accelerating energies selected in the range of 50 to 150 KeV or using different kinds of ions selected from a group of neon ion, proton $H^+$, helium and so forth.

In FIG. 6, the solid line curve shows dispersion in the collapse field $\Delta H_{02}$ which is caused by the presence of a hard bubble. The dispersion in the collapse field $\Delta H_{02}$ varies with the condition for ion implantation and becomes very small in a certain range of dose of ions. FIG. 6 shows that the dispersion $\Delta H_{02}$ is substantially zero when the dose is in the range of $3.5 \times 10^{13}$ to $1 \times 10^{15}$. Accordingly, by selecting the dose of ions in this range so that the increment $\Delta H_O$ of the collapse field may have a desired value, optimum bias field values can be set for respective regions of the magnetic bubble device.

With the present invention, by performing ion implantation for the bubble stretching region under a condition different from those for the other regions, the bias field value for stable operation of the bubble can be made nearly equal to the bias field value for stable bubble operation in the propagation path, thereby providing markedly improved operating margin of the entire magnetic bubble device, as indicated by the hatched area in FIG. 5. Further, a plurality of chips can be mounted in the same package with a good margin, even if there is a variation in the characteristics of the chips.

In the foregoing, the present invention has been described with respect to the formation of a bubble detector where the bubble stretches, but the invention is not limited specifically thereto and is also applicable to the bubble generator and other regions.

Further, it is also possible to reduce a maximum bubble generating current $I_{Gmin}$ by performing ion implantation for only a nucleation part of the bubble generator under a condition different from those for the other regions. In the case of employing a major-minor loop structure, reduction of the distance between adjacent ones of minor loops is indispensable to the formation of the magnetic bubble device with high density; in this case, it is possible to prevent strip out of a bubble between adjacent minor loops by providing therebetween a strip-like region formed by ion implantation under a condition different from those for the other regions. Moreover, the phase margin can be increased by implanting ions in the replicator to provide an increased collapse field so that a bubble can be stretched long even in the presence of a strong bias field. Thus, when applied to a magnetic bubble device, the present invention produces various effects and provides for enhanced performance of the device as a whole.

It will be apparent that many modifications and variations may be effected without departing from the scope of the novel concepts of this invention.

What is claimed is:

1. A magnetic bubble device comprising a magnetic thin film serving as a medium for propagation of a magnetic bubble and having first and second regions which are formed by first and second ion implantation processes, respectively, wherein said first region is a bubble propagation path and said second region is a bubble stretching region, said first and second regions formed so that the bias field value of the bubble stretching region is substantially equal to the bias field value of the bubble propagation path.

2. A magnetic bubble device comprising a magnetic thin film serving as a medium for propagation of a magnetic bubble and having first and second regions which are formed by first and second ion implantation processes, respectively, wherein said first region is a bubble propagation path and said second region is a nucleation part of a bubble generator, said first and second regions formed so that the bubble generating current is reduced.

3. A magnetic bubble device comprising a magnetic thin film serving as a medium for propagation of a magnetic bubble and having first, second and third regions which are formed by first, second and third ion implantation processes, respectively, wherein said first and third ion implantation processes are the same, wherein said second ion implantation process is different from said first ion implantation process, and wherein said first and third regions are bubble propagation paths and said second region formed to prevent strip out of a bubble is a strip-like region between said bubble propagation paths.

4. A magnetic bubble device set forth in claim 1, 2 or 3 wherein said first and second ion implantation processes comprise selectively implanting one of $H^+$, $Ne^+$ and $He^+$ ions at an ion dosage in the range of $7 \times 10^{13}/cm^2$ to $5 \times 10^{14}/cm^2$ and at an ion acceleration energy in the range of 50 KeV to 150 KeV, so that the operating margins of the magnetic bubble stable operation regions of said first and said second regions are made equal.

5. A magnetic bubble system, operated in the presence of a bias field, comprising a plurality of magnetic bubble devices operated in the presence of the bias field, each of said plurality of magnetic bubble devices respectively formed by a plurality of ion implantation processes, each of said magnetic bubble devices comprising a magnetic thin film serving as a medium for propagation of a magnetic bubble and having first and second regions which are formed by different ones of the said plurality of ion implantation processes, said first and second regions each performing a different one of the functions of generation, propagation and detection of a magnetic bubble, each of said plurality of ion implantation processes comprising selectively implanting one of $H^+$, $Ne^+$ and $He^+$ ions at an ion dosage in the range of $7 \times 10/^{13}/cm^2$ to $5 \times 10^{14}/cm^2$ and an ion acceleration energy in the range of 50 KeV to 150 KeV, so that the operating margins of the magnetic bubble stable operation regions of the respective magnetic bubble devices and of said first and second regions, of which the magnetic bubble devices are comprised, are made equal.

6. A magnetic bubble system, operated in the presence of a bias field, comprising a plurality of magnetic bubble devices operated in the presence of the bias field, each of said plurality of magnetic bubble devices respectively formed by a plurality of ion implantation processes, each of said plurality of ion implantation processes comprising selectively implanting one of $H^+$, $Ne^+$ and $He^+$ ions at an ion dosage in the range of $7 \times 10^{13}/cm^2$ to $5 \times 10^{14}/cm^2$ and at an ion acceleration energy in the range of 50 KeV to 150 KeV so that the operating margins of the magnetic bubble stable operation regions of the respective magnetic bubble devices are made equal.

* * * * *

UNITED STATES PATENT AND TRADEMARK OFFICE
CERTIFICATE OF CORRECTION

PATENT NO.  : 4,346,456
DATED       : August 24, 1982
INVENTOR(S) : Ryoichi Kinoshita et al.

It is certified that error appears in the above-identified patent and that said Letters Patent is hereby corrected as shown below:

Column 3, line 43, after "under" insert --different--;
         line 44, delete "P"; begin new paragraph with "Fig. 6";
         line 59, "30" should be "-- + --".

Column 5, line 16, delete "formed to prevent strip out of a bubble";
         line 17, after "region" insert --formed to prevent strip out of a bubble--.

Signed and Sealed this

Nineteenth Day of April 1983

[SEAL]

Attest:

Attesting Officer

GERALD J. MOSSINGHOFF

Commissioner of Patents and Trademarks